United States Patent [19]

Kasperkovitz et al.

[11] Patent Number: 5,220,686
[45] Date of Patent: Jun. 15, 1993

[54] TUNABLE RESONANCE AMPLIFIER

[75] Inventors: Wolfdietrich G. Kasperkovitz, Waalre; Hendricus C. De Ruijter, Eindhoven, both of Netherlands

[73] Assignee: U.S. Philips Corporation, New York, N.Y.

[21] Appl. No.: 613,803

[22] PCT Filed: Apr. 20, 1990

[86] PCT No.: PCT/NL90/00053

§ 371 Date: Dec. 20, 1990

§ 102(e) Date: Dec. 20, 1990

[30] Foreign Application Priority Data

Apr. 21, 1989 [NL] Netherlands ............ 8901005

[51] Int. Cl.$^5$ ............................................. H04B 1/06
[52] U.S. Cl. ................... 455/234.1; 455/240.1; 330/254; 330/98
[58] Field of Search ............. 455/234, 240, 197; 330/302, 303, 304, 252, 254, 98, 85

[56] References Cited

U.S. PATENT DOCUMENTS

| | | | |
|---|---|---|---|
| 3,792,367 | 2/1974 | Fleischer et al. | 330/98 |
| 3,792,367 | 2/1974 | Fleischer | 330/69 |
| 4,291,276 | 9/1981 | Ida | 330/85 |
| 4,742,565 | 5/1988 | Iwahashi | 455/234 |
| 4,776,040 | 10/1988 | Ichikawa et al. | 455/240 |

*Primary Examiner*—Reinhard J. Eisenzopf
*Assistant Examiner*—Christine K. Belzer
*Attorney, Agent, or Firm*—Leroy Eason

[57] ABSTRACT

An amplifier with a non-regenerative DC negative feedback loop which incorporates first and second first-order low-pass RC filters, has a signal path arranged from an input to an output and a feedback path arranged from the output to the input, and has a controlled loop gain. To provide substantially even selective amplification over a comparatively large tuning control range, the signal path incorporates one of the two RC filters and the feedback path incorporates the other RC filter together with the controlled loop gain; or the signal path incorporates the two RC filters together with one part of the controlled loop gain and the feedback path incorporates the other part of the controlled loop gain. To reduce the required power supply voltage and hence decrease the power dissipation of a frequency synthesis circuit, a tunable resonance amplifier is arranged between the voltage-controlled oscillator and the frequency divider circuit, and the loop filter is coupled to a tuning control input of the tunable resonance amplifier for simultaneously tuning the voltage-controlled oscillator and the tunable resonance amplifier.

24 Claims, 6 Drawing Sheets

TUNABLE RESONANCE AMPLIFIER

BACKGROUND OF THE INVENTION

1. Field of the Invention

The invention relates to a tunable resonance amplifier comprising a non-regenerative DC negative feedback loop, which incorporates first and second first-order low-pass RC filters, has a signal path arranged from an input to an output and a feedback path arranged from the output to the input and has a controlled loop gain.

The invention also relates to a frequency synthesis circuit comprising a frequency divider circuit, a phase detector, a loop filter and a voltage-controlled oscillator successively incorporated in a phase-locked loop.

The invention also relates to a superheterodyne receiver with an adaptive IF signal processing.

2. Description of the Related Art

A tunable resonance amplifier of this type is known, for example, from German Patent Specification No. 1,262,466.

A frequency synthesis circuit of this type is known, for example by the type indication LM 7005 of Sanyo.

A superheterodyne receiver of this type is known, for example, from U.S. Pat. No. 3,541,451.

In the signal path from the input to the output the known resonance amplifier successively comprises a voltage signal adding circuit, an inverting controllable voltage amplifier and an RC network composed of a cascade arrangement of the first and the second first-order low-pass RC filters. The output of the resonance amplifier is connected to the adder circuit via the feedback path, resulting in a DC negative feedback loop with a controllable loop gain.

The known resonance amplifier has a bandpass characteristic around a tunable resonance frequency which can be varied by controlling the loop gain. At this resonance or tuning frequency the frequency-dependent transmission of the resonance amplifier is maximum. The passbandwidth of this resonance amplifier is determined by the time constants of the two RC filters and is independent of the loop gain. This provides the possibility of varying the tuning frequency and hence the frequency location of the pass range at a constant size of the bandwidth.

However, the known resonance amplifier has a selective gain which increases with an increasing tuning frequency, and conversely. Although the increase of the selective gain can be reduced with an increasing tuning frequency by means of an extra integrator arranged in series with the signal path, such an integrator introduces unwanted effects such as, for example a very strong increase of the output signal of the amplifier at a tuning frequency decreasing to zero. The field of use of this known tunable resonance amplifier is comparatively small, also because of this frequency-dependent selective gain. Application in, for example, receiver tuning devices for a tunable channel RF selection of a desired RF reception signal is not possible.

SUMMARY OF THE INVENTION

The invention has for its object to obviate these drawbacks in a simple manner.

According to the invention a tunable resonance amplifier of the type described in the opening paragraph is therefore characterized in that the signal path incorporates one of the two said RC filters and the feedback path incorporates the other RC filter together with the controlled loop gain, or the signal path incorporates the two said RC filters together with one part of the controlled loop gain and the feedback path incorporates the other part of the controlled loop gain.

The invention is based on the recognition that a compensation of the frequency-dependent selective gain of the known resonance amplifier can be obtained without extra components by a suitably chosen distribution of the loop gain and the filter action on the signal and feedback path of the loop.

When using the measure according to the invention, an effective compensation of the frequency-dependent variation of the selective gain of the resonance amplifier is obtained while maintaining a constant bandwidth. This is achieved without the use of extra gain controls and/or circuits such as integrators which increase the costprice and/or even introduce unwanted effects. The tunable resonance amplifier according to the invention is therefore suitable for many applications, inter alia for realizing in radio and TV receivers a tunable channel RF selection and/or for realizing a fixed IF selection of a desired RF or IF reception signal in the case of a suitably chosen tuning.

A tunable resonance amplifier according to the invention is preferably characterized in that the loop comprises in a closed loop form and successively arranged in cascade a first controlled amplifier, the first RC filter, a second controlled amplifier and the second RC filter, the two amplifiers and the two RC filters being mutually substantially identical.

When using this measure, each of the two amplifiers can be varied in gain over a comparatively large control range without unwanted phenomena such as, for example, saturation occurring therein. With this preferred measure the tuning range of the resonance amplifier according to the invention is increased considerably. Moreover, this preferred embodiment is not only suitable for a frequency selection of single-phase signals but, with suitably chosen input and output terminals, it is also suitable for selecting phase quadrature signals or it is suitable as a selective phase splitter or as a selective adder circuit.

A preferred embodiment having a comparatively simple circuit configuration which is also suitable to be realised in an integrated form is characterized in that the first and second controlled amplifiers comprise first and second transconductance circuits each having a controllable transconductance from a voltage input to a current output; and in that in the loop the current outputs of the first and second transconductance circuits are coupled via parallel RC members of the first and second RC filters to the voltage inputs of the second and first transconductance circuits, respectively. The loop includes means for signal inversion, the input of the resonance amplifier is coupled to the input of at least one of the two transconductance circuits for applying an input signal current thereto, and the output of the resonance amplifier is coupled to the output of one of the two transconductance circuits for applying an output signal voltage thereto.

An embodiment which is suitable for a selective gain of quadrature signals is characterized in that the input and the output of the tunable resonance amplifier comprise an in-phase and a quadrature input terminal and an in-phase and a quadrature output terminal, respectively, one of the two first and second transconductance circuits being arranged between said two input terminals and output terminals.

When using this measure, use is made of the fact that the phase shift through each one of the first and second parallel RC members at the respective outputs of the first and second transconductance circuits at the resonance frequency is 90° or is 90° in at least a very close approximation.

A further preferred embodiment of the tunable resonance amplifier according to the invention is characterized in that the outputs of the first and second transconductance circuits are connected to inputs and outputs of third and fourth transconductance circuits, respectively.

When using this measure, the third and fourth transconductance circuits constitute an extra resistor parallel to the load resistor and the capacitance load and a reduction of the power dissipation and a decrease of the required power supply voltage is obtained.

A further embodiment of such a resonance amplifier, which is characterized in that the transconductance of the third and fourth transconductance circuits are controllable, provides the possibility of reducing the bandwidth by varying the last-mentioned transconductances and of simultaneously increasing the gain, or conversely.

This embodiment is particularly suitable for use in receivers, for example, for automatic gain control (AGC). By controlling the transconductances of the third and fourth transconductance circuits with an AGC signal, it is achieved that weaker RF reception signals, which must be amplified to a larger extent as compared with stronger RF reception signals, are selected with a narrower bandwidth than said stronger RF reception signals. Since such weaker RF reception signals comprise relatively more noise components than the stronger RF reception signals, a dynamic noise suppression is obtained simultaneously with such a gain control.

An embodiment which provides the possibility of adjusting the resistance or of varying the load to very large values is characterized in that each one of the third and fourth transconductance circuits is positively fed back from the output to the input. When using this measure, the third and fourth transconductance circuits constitute a negative resistor, therewith enabling a high effective load resistor to be realised when using a comparatively small load resistor without an increase of the power supply voltage and hence the power dissipation.

An embodiment which is particularly suitable for the TV VHF/UHF and/or the TV satellite frequency range is characterized in that each one of the third and fourth transconductance circuits is negatively fed back from the output to the input. When using this measure, the third and fourth transconductance circuits constitute a positive resistor which with unwanted phase shifts due to delay time effects can be compensated at frequencies in the last-mentioned frequency range so that oscillation can be prevented.

An embodiment in which the gain of the tunable resonance amplifier can be adjusted in a simple manner is characterized in that the input signal of the resonance amplifier is applied via an input transconductance circuit to the input of at least one of the two first and second transconductance circuits.

To control the last-mentioned gain within the tuning range without varying the bandwidth, a further embodiment is characterized in that the input transconductance circuit is controllable.

A practical embodiment which is particularly suitable for integration is characterized in that the first and second transconductance circuits comprise first and second difference pairs, respectively. The first and second difference pairs comprise first and second, and third and fourth emitter-coupled transistors with a first and a second current source transistor arranged in a common emitter tail configuration. The two current source transistors are controllable from a first common control circuit having a tuning control input for controlling the transconductance of the first and second transconductance circuits, the collectors of said first to fourth transistors each being connected to the power supply voltage via first to fourth load resistors, respectively, and being coupled to the bases of the fourth, third, first and second transistors. First and second capacitances are arranged between the collectors of the first and second, and the third and fourth transistors, respectively. When using this measure, the load resistors are not only used for a desired attenuation of the selective operation of the loop circuit, but they also simplify the realisation of a suitable working point of the transistors.

An embodiment in which oscillation at high frequencies due to, inter alia, delay time effects in said first and second difference pairs is avoided, is characterized in that first and second load series resistors are arranged in series with the first and second capacitances, respectively. Said load series resistors reduce the phase shift effect due to parasitic delay times in the difference pairs.

An embodiment in which the effect of the frequency-dependent base input resistance of the difference pairs on the quality factor and the bandwidth of the resonance amplifier is reduced is characterized in that base series resistors are arranged between the collectors of the third, fourth, second and first transistors and the bases of the first to fourth transistors.

A practical embodiment of the third and fourth transconductance circuits is characterized in that the third and fourth transconductance circuits comprise third and fourth difference pairs with fifth and sixth, and seventh and eighth emitter-coupled transistors, respectively, comprising a third and a fourth current source transistor arranged in a common emitter tail configuration for adjusting the transconductance of the third and fourth transconductance circuits. The bases of the fifth to eighth transistors are coupled to the collectors of the first to fourth transistors, and the transistors of the third and fourth difference pairs are fed back from collectors to bases.

Another way of reducing the influence of the frequency-dependent base input resistance on the bandwidth different from the one mentioned hereinbefore is possible in an embodiment which is characterized in that the third and fourth current source transistors are controllable from a second common control circuit for controlling the transconductance of the third and fourth transconductance circuits.

A practical realisation of a positive feedback of the third and fourth transconductance circuits is characterized in that the collectors of the fifth to eighth transistors are coupled to the bases of the sixth, fifth, eighth and seventh transistors, respectively.

A practical realisation of a negative feedback is characterized in that each one of the fifth to eighth transistors is fed back from collector to base.

A preferred embodiment using a less critical and hence accurate control of the transconductance of the third and fourth transconductance circuits is characterized in that an emitter resistor is incorporated in the emitter lead of each one of the fifth to eighth transistors.

An embodiment which is particularly suitable for very high frequencies, for example in the TV satellite frequency range, is characterized in that the fifth to eighth transistors are fed back from collector to base via the base-emitter junction of ninth to twelfth transistors, respectively, and in that the collectors of the first to fourth transistors are coupled to the bases of the fourth, third, first and second transistors, respectively. When using this measure, the cut-off frequency of the signal-processing transistors is increased.

A practical embodiment of the input transconductance circuit is characterized in that the input transconductance circuit comprises a differential stage having first and second emitter-coupled input transistors and a current source in a common emitter lead whose collectors are connected to the bases of the transistors of one of the two difference pairs.

The known frequency synthesis circuit utilizes a wideband amplifier between the voltage-controlled tuning oscillator and the frequency divider in order to comply with the existing radiation requirements and it has a comparatively complex and hence expensive circuit configuration.

The invention has for its second object to provide a frequency synthesis circuit which can be realised, inter alia, at lower cost and has less power dissipation than the known frequency synthesis circuit.

According to the invention such a frequency synthesis circuit is therefore characterized in that a tunable resonance amplifier as described hereinbefore is arranged between the voltage-controlled oscillator and the frequency divider circuit, the loop filter being coupled to a tuning control input of the tunable resonance amplifier for simultaneously tuning the voltage-controlled oscillator and the tunable resonance amplifier.

When using this measure according to the invention, a comparatively high selective amplification of the oscillator signal can be obtained by means of the tunable resonance amplifier with only a comparatively small power dissipation, so that the oscillator signal amplitude may be chosen to be small.

The invention has for its third object to provide a superheterodyne AM and/or FM receiver with an adaptive IF signal processing, which can be realised more easily than the known receiver.

Such a superheterodyne AM receiver successively comprising an RF input section, a tunable mixer stage, an AM-IF section and an AM demodulation device is characterized in that the AM-IF section comprises a tunable resonance amplifier which is provide with a non-regenerative DC negative feedback loop which incorporates first and second first-order low-pass RC filters, has a signal path arranged from an input to an output and a feedback path arranged from the output to the input, and has a controlled loop gain. The signal path incorporates one of the two RC filters and the feedback path incorporates the other RC filter together with the controlled loop gain; or the signal path incorporates the two filters together with one part of the controlled loop gain, and the feedback path incorporates the other part of the controlled loop gain, said loop gain being realised by first and second transconductance circuits each having a controllable transconductance from a voltage input to a current output. In the loop the current outputs of the first and second transconductance circuits are coupled via parallel RC members of the first and second RC filters to the voltage inputs of the second and first transconductance circuits, respectively, and the loop includes means for signal inversion. The input of the resonance amplifier is coupled to the input of at least one of the two transconductance circuits for applying an input signal current thereto, and the output of the resonance amplifier is coupled to the output of one of the two transconductance circuits for applying an output signal voltage thereto, the outputs of the first and second transconductance circuits being connected to inputs and output of third and fourth transconductance circuits, respectively. The third and fourth transconductance circuits are controllable and are coupled via a control input to an output of an automatic gain control signal generating circuit.

When using this measure, the gain of the AM, IF section is increased with a decreasing field strength, accompanied by a reduction of the bandwidth, and conversely. Since the influence of noise on weak reception signals is greater than on strong reception signals, a stabilization of the noise impression on a comparatively low noise level is simultaneously obtained with an automatic gain control.

A superheterodyne FM receiver successively comprising an RF input section, a tunable mixer stage, an FM-IF section and an FM demodulation device is characterized in that the FM-IF section comprises a tunable resonance amplifier which is provided with a non-regenerative DC negative feedback loop having a controlled loop gain. The loop incorporates first and second first-order low-pass RC filters, has a signal path arranged from an input to an output and a feedback path arranged from the output to the input. The signal path incorporates one of the two RC filters and the feedback path incorporates the other RC filter together with the controlled loop gain; or the signal path incorporates the two filters together with one part of the controlled loop gain, and the feedback path incorporates the other part of the controlled loop gain. The loop gain is realised by first and second transconductance circuits each having a controllable transconductance from a voltage input to a current output, and in the loop the current outputs of the first and second transconductance circuits are coupled via parallel RC members of the first and second RC filters to the voltage inputs of the second and first transconductance circuits, respectively. The loop includes means for signal inversion, the input of the resonance amplifier being coupled to the input of at least one of the two transconductance circuits for applying an input signal current thereto, and the output of the resonance amplifier being coupled to the output of one of the two transconductance circuits for applying an output signal voltage thereto, the outputs of the first and second transconductance circuits being connected to inputs and outputs of third and fourth transconductance circuits, respectively. The third and fourth transconductance circuits are controllable and are coupled to an output of a reception quality detection circuit via a control input, and the first and second transconductance circuits are coupled to an output of the FM demodulation device via a control input.

When using this measure, both a high IF selectivity and a receiver performance which is largely independent of reception quality variations are obtained in a simple manner.

The invention will be described in greater detail with reference to the Figures shown in the drawings which only serve to illustrate the description and in which corresponding elements have the same references.

DESCRIPTION OF THE PREFERRED EMBODIMENTS

Figure 1:
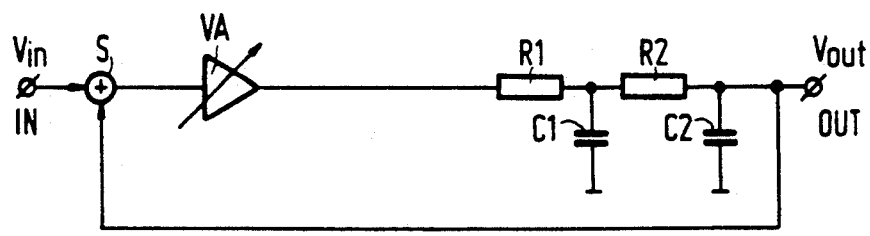
FIG. 1 shows a known tunable resonance amplifier.

FIG. 1 shows the basic circuit diagram of the known tunable resonance amplifier according to said German Patent Specification no. 1,262,466, which selectively amplifies an input signal voltage $V_{in}$ applied to an input IN to an output signal voltage $V_{out}$ at an output OUT. The known resonance amplifier comprises a non-regenerative loop having a signal path from the input IN to the output OUT successively incorporating: a voltage adder circuit S, a controlled voltage amplifier VA and a cascade circuit of first and second first-order RC low-pass filters R1C1 and R2C2, respectively. Each low-pass filter R1C1 and R2C2 comprises a serial resistor R1, R2 and a parallel capacitor C1, C2, respectively, connected to ground. The output of R2C2, i.e. the common junction point between R2 and C2, is connected to the output OUT of the resonance amplifier. The loop also comprises a feedback path via which the output OUT is coupled to the voltage adder circuit S. The voltage adder circuit S adds the input voltage $V_{in}$ to the output voltage $V_{out}$ and applied the sum voltage $V_{in} + V_{out}$ thus obtained to the voltage amplifier VA.

The voltage amplifier VA realises a controlled loop gain as well as a signal inversion. Since R1C1 and R2C2 realise a frequency-dependent phase shift, which is only zero for the DC component, said signal inversion results in a DC negative feedback in the loop.

Said German Patent Specification shows that the tunable resonance amplifier of FIG. 1, starting from mutually identical low-pass filters R1C1 and R2C2 with R1=R2=R and C1=C2=C and a gain −A in the controllable voltage amplifier VA has a resonance frequency $W_o$ which is equal $\sqrt{(1+A)}/RC$, a quality factor Q which is equal to $\sqrt{(1+A)}/3$ and a band $\Delta W$ which is equal to 3/RC. The transmission factor at the resonance frequency, or the selective amplification is substantially equal to jQ. As is apparent from the foregoing, a variation of the gain factor −A of the voltage amplifier VA may lead to a tuning of the resonance frequency $W_O$ at a desired value without a variation of the bandwidth $\Delta W$. However, such a tuning variation results in a variation of the selective amplification of the resonance amplifier as a whole. This property is fundamental for the known resonance amplifier. It is true that the increase of the selective amplification with an increase of the tuning frequency can be compensated for by arranging an integrator in series with the known resonance amplifier in known manner. However, such an extra integrator introduces a strong increase of the selective amplification at a tuning decreasing to the zero frequency until theoretically infinite at the zero frequency itself.

Figure 2A:
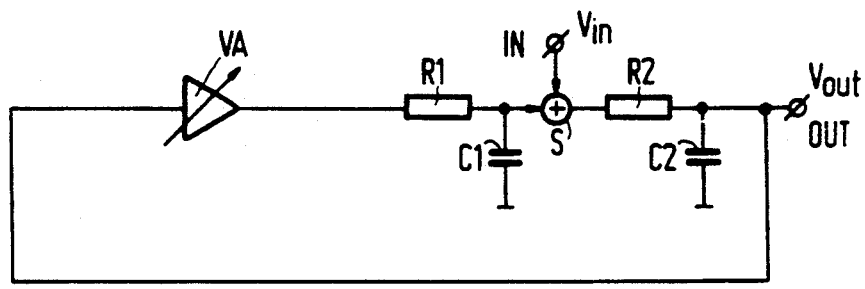
FIGS. 2a to 2c show first to third embodiments of the tunable resonance amplifier according to the invention.
Figure 2B:
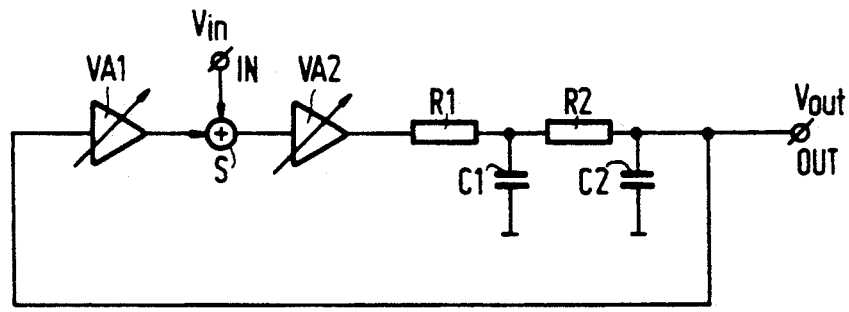

FIGS. 2a and 2b are block diagrams of first and second embodiments of a tunable resonance amplifier according to the invention, each amplifier selectively amplifying an input signal voltage $V_{in}$ applied to the input IN to an output signal voltage $V_{out}$ at the output OUT.

In said first embodiment as shown in FIG. 2a the signal path from the input IN to the output OUT only incorporates the second low-pass filter R2C2 and the feedback path from the output to the input incorporates the other loop elements, namely the controlled loop gain realised by the controllable voltage amplifier VA and the first low-pass filter R1C1. To this end the voltage adder circuit S is incorporated between the two low-pass filters R1C1 and R2C2. An alternative, which is not shown, of this tunable resonance amplifier according to the invention is obtained by arranging the adder circuit S between VA and R1C1 and by using the output of R1C1 as output OUT of the resonance amplifier. The signal path of this alternative, which is not shown, incorporates the first low-pass filter R1C1 and the feedback path incorporates the second low-pass filter R2C2 succeeded by the controllable voltage amplifier VA.

Unlike the resonance amplifier of FIG. 2a, the controlled loop gain in said second embodiment is not realised by means of a single controllable voltage amplifier but by the cascade circuit of several controllable voltage amplifiers each realising a part and jointly realising the total loop gain. The version shown in FIG. 2b comprises a cascade circuit of first and second controllable voltage amplifies denoted by VA1 and VA2, respectively. The voltage amplifiers VA1 and VA2 preferably have a mutually equal amplification so that each of them realises half the total loop gain in dB and a signal inversion takes place in one of these voltages amplifiers. The adder circuit S is arranged between VA1 and VA2 so that the signal path from the input IN to the output OUT incorporates a cascade circuit of the second controllable voltage amplifier VA2, the first and the second low-pass filters R1C1 and R2C2, respectively and the feedback path from the output OUT to the input IN incorporates the first controllable voltage amplifier VA1. An alternative, which is not shown, is obtained by arranging the adder circuit S between the second voltage amplifier VA2 and the first low-pass filter R1C1 and by using the output of the first voltage amplifier VA1 as output OUT of the resonance amplifier. In this case the signal path from IN to OUT incorporates the cascade circuit of the two low-pass filters R1C1 and R2C2 and the first voltage amplifier VA1, while the feedback path from OUT to IN incorporates the second voltage amplifier VA2.

Figure 2C:
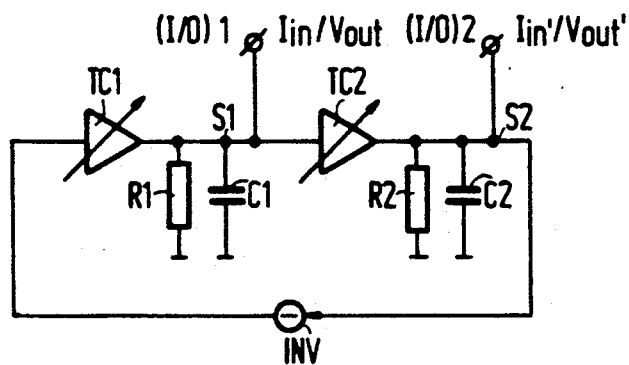

FIG. 2c shows a third embodiment of a tunable resonance amplifier according to the invention which can be more easily realised in practice as compared with that shown in FIGS. 2a and 2b. The loop is formed by a cascade circuit of first and second transconductance circuits TC1 and TC2 having a controllable transconductance whose outputs are coupled to a parallel circuit, functioning as the first low-pass filter R1C1, of a first load capacitor C1 and a first load resistor R1 and a parallel circuit, functioning as the second low-pass filter R2C2, of a second load capacitor C2 and a second load resistor R2, respectively, said two parallel circuits being connected to ground. The two transconductance circuits TC1 and TC2 together with the parallel circuits R1C1 and R2C2 constitute first and second sections which mutually correspond. In the embodiment shown the output of the second transconductance circuit TC2 is connected to the input of the first transconductance circuit TC1 via a voltage inverter circuit INV. The result is a closed loop circuit in which a phase shift of 360° occurs at very high resonance frequency values, and an infinite resonance frequency value in the theoretical case. The resonance frequency is the frequency for which the gain of one occurs in the closed loop. In practice the phase shift at the resonance frequency across each section appears to be 90° in a very close approximation, but with a suitable dimensioning there is a sufficient phase margin left to avoid oscillation.

The loop circuit has a bandpass characteristic whose resonance frequency is controllable by means of a variation of the transconductance of TC1 and TC2 and whose bandwidth is adjustable by means of a correctly chosen RC value for the parallel circuits R1C1 and R2C2.

The inverter INV can be incorporated at any arbitrary position in the loop and may be omitted if a signal inversion takes place in one of the transconductances TC1 and TC2. For reasons of symmetry the section formed by TC1 and R1C1 is preferably equal to the section formed by TC2 and R2C2. In a balanced implementation a signal inversion is simply obtained by providing a cross-coupling in the loop, which will be further described with reference to FIGS. 5 and 7.

The transconductance circuits TC1 and TC2 each supply output currents $I_{o1}$ and $I_{o2}$, respectively, which vary with input voltages $V_{i1}$, and $V_{i2}$, the transconductances $I_{o1}V_{i1}$ and $I_{o2}V_{i2}$ being controllable. The controllable voltage-current conversion in TC1 and TC2 thus obtained is succeeded by a fixed current-voltage conversion across R1C1 and R2C2, respectively, so that together with the voltage inverter INV a DC negative feedback is obtained in the loop and a loop gain is obtained which is controllable by controlling the transconductances of TC1 and TC2.

In the embodiment shown in FIG. 2c the tunable resonance amplifier has first and second terminals (I/O)1 and (I/O)2, respectively, which are connected to the common junction point of TC1 and R1C1, and TC2 and R2C2 denoted by S1 and S2, respectively. In a first mode the first terminal (I/O)1 or the second terminal (I/O)2 is used as a current input and simultaneously as a voltage output of the resonance amplifier. In a second mode the first terminal (I/O)1 is used as a current input and the second terminal (I/O)2 is used as a voltage output, or conversely. In a third mode the tunable resonance amplifier is used for filtering a pair of phase quadrature signals, the first and second terminals (I/O)1 and (I/O)2 constituting both a phase quadrature current input terminal pair and a phase quadrature voltage output terminal pair.

In the first mode an input signal current $I_{in}$ is applied, for example to the first terminal (I/O)1 and is added at the junction point S1 to the output current $I_{o1}$ of TC1. The output impedance of TC1, viewed from S1, is inductive and may be considered to be replaced by a coil L1 (not shown) which is arranged parallel across R1C1. The voltage at S1 across R1C1 is thereby mainly in phase with the input signal current $I_{in}$ at the resonance frequency $f_{res}$ of the resonance amplifier and is equal to the sum of the sub-voltages which are produced by each of the currents $I_{in}$ and $I_{o1}$ across R1C1. This voltage is available at the first terminal (I/O)1 as output signal voltage $V_{out}$.

Although the first terminal (I/O)1 is used as a current input and a voltage output, the signal path of the loop from the current input to the voltage output incorporates the first low-pass filter R1C1 in this first mode and the feedback path of the loop from the voltage output to the current input incorporates the cascade circuit of TC2, R2C2, INV and TC1. As already noted hereinbefore, TC1 and TC2 realise the controlled loop gain.

In a corresponding manner an input signal current $I'_{in}$ at the second terminal (I/O)2 results in an output voltage $V'_{out}$ at S2 across R2C2 which is substantially in phase with the input signal current $I'_{in}$ at $f_{ref}$ and which is the sum of the sub-voltages produced by $I'_{in}$ and the output current of TC2, $I_{o2}$ across R2C2. The signal path of the loop from the current input to the voltage output incorporates the second low-pass filter R2C2 and the feedback path of the loop from the voltage output to the current input incorporates the cascade circuit of INV TC1, R1C1 and TC2.

In said third mode (I/O)1 and (I/O)2 constitute in-phase and quadrature terminals, respectively, to which the in-phase and quadrature components of a phase quadrature input signal current are applied. In the manner described hereinbefore the in-phase and quadrature components of the phase quadrature output signal voltage produced by this phase quadrature input signal current become available at the same terminals (I/O)1 and (I/O)2, respectively.

In said second mode with, for example the first terminal (I/O)1 as the current input and the second terminal (I/O)2 as the voltage output the signal path of the loop from the current input to the voltage output incorporates the cascade circuit of the first low-pass filter R1C1, the second transconductance TC2 and the second low-pass filter R2C2, and the feedback path from the voltage output to the current input incorporates the inverter circuit INV as well as the first transconductance TC1. Consequently the controlled loop gain is evenly distributed over the signal and feedback paths of the loop in the case of a symmetrical implementation in this second mode. As stated hereinbefore, an input current $I_{in}$ applied to (I/O)1 produces a voltage at S1 which is substantially in phase with $I_{in}$. This in-phase voltage is converted in TC2 into a current $I_{o2}$ which is in phase with the last-mentioned voltage and is hence substantially in phase with $I_{in}$. The current $I_{o2}$ produces a voltage at S2 across R2C2, which voltage is substantially shifted 90° in phase with respect to $I_{o2}$ so that an output voltage V'$_{out}$ is obtained at (I/O)2 which at f$_{res}$ is shifted 90° in phase or at least very close to 90° with respect to I$_{in}$.

Figure 3:
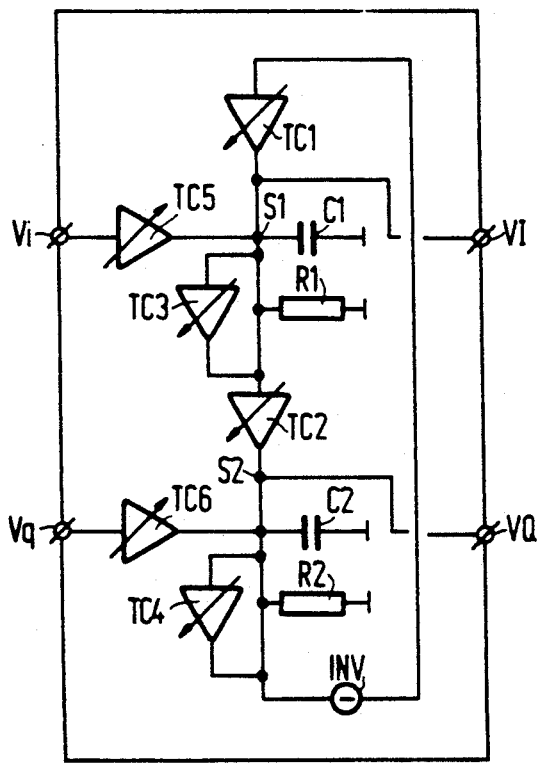
FIG. 3 is a block diagram of a preferred embodiment of a tunable resonance amplifier according to the invention.

FIG. 3 shows a preferred embodiment of a tunable resonance amplifier RA according to the invention, based on the amplifier shown in FIG. 2c. The preferred embodiment shown has an input with in-phase and quadrature voltage input terminals Vi and Vq and an output with in-phase and quadrature voltage output terminals VI and VQ. VI and VQ correspond to the first and second terminals (I/O)1 and (I/O)2, respectively, of FIG. 2c.

To provide the possibility of an electronic adjustment of the bandwidth, the tunable resonance amplifier RA comprises third and fourth transconductance circuits TC3 and TC4 each of which is fed back from output to input and is arranged at the outputs of TC1 and TC2, respectively. These transconductance circuits TC3 and TC4 realise an extra resistor which can be considered to be arranged parallel to the parallel circuits R1C1 and R2C2, respectively.

A variation of the transconductance of TC3 and TC4 not only results in a variation of the bandwidth but also in a variation of the selective amplification at the resonance frequency without influencing the tuning frequency. A decrease of the bandwidth is accompanied by an increase of the selective amplification so that this tunable resonance amplifier is particularly suitable for use as an IF filter in a receiver for a noise adaptive signal selection and amplification. This will be further elucidated in FIG. 9.

In the case of a positive feedback from output to input as shown, they realise a negative resistor which together with R1 and R2 at a value approximating that of R1 and R2 in an absolute sense may give rise to very high effective resistance values and enable a simple adjustment at a high quality factor or a narrow bandwidth. Moreover, R1 and R2 can be chosen to be small by using this measure so that, dependent on the form of realisation, the power supply voltage and hence the power dissipation can be maintained at a low value.

In the case of a negative feedback (not shown) from output to input, for example by means of an inverter circuit in the signal path of TC3 and TC4 (not shown) they realise a positive resistor with which an attenuation of the bandpass characteristic of the resonance amplifier is possible and with which phase shifts due to parasitic delay time effects can be compensated. Dependent on the nature of the prevailing parasitic effects, i.e. dependent on the frequency to be processed, a positive or negative feedback of TC3 and TC4 is used in order to obtain a correct operation of the resonance amplifier. To this end the transconductance of TC3 and TC4 can be adjusted at a fixed value.

However, it is alternatively possible to control the transconductance of TC3 and TC4 in a suitable manner, for example, in a manner which is to a certain extent dependent on the transconductance of TC1 and TC2. It can thereby be achieved that the bandwidth remains constant within accurate limits over a comparatively large tuning range of the tunable resonance amplifier and a correct operation of the resonance amplifier is maintained.

The tunable resonance amplifier RA shown has an input transconductance circuit comprising first and second input transconductance divider circuits TC5 and TC6. The circuits TC5 and TC6 are arranged between the in-phase input terminal Vi and the junction point S1 and between the quadrature input terminal V$_q$ and the junction point S2. The output of TC1, or S1, and the output of TC2, or S2, are coupled to the in-phase output terminal VI and the quadrature output terminal VQ, respectively, of the tunable resonance amplifier RA. The input transconductance circuit TC5, TC6 converts a pair of phase quadrature input voltages into a pair of phase quadrature input currents and applies these currents to the loop circuits at said junction points between which one of the two first and second transconductance circuits TC1 and TC2 is arranged. As a result the phase quadrature relation of the phase quadrature input voltages to be amplified is maintained. The amplified phase quadrature voltages are coupled out from said points in the loop circuit. By means of a correct adjustment of the transconductance of TC5 and TC6 the gain factor of the resonance amplifier can be adjusted to a desired value.

A variation of TC3 and TC4 results in a variation of said gain factor, which can be compensated for over a large tuning range by a suitable control of TC5 and TC6.

FIGS. 4a to 4f show a number of connection and coupling-out possibilities of the tunable resonance amplifier RA according to the invention in which the elements corresponding to those of FIG. 3 have the same references.

Figure 4A:
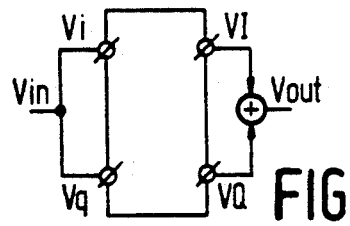
FIGS. 4a to 4f show a number of drive and coupling-out possibilities of the tunable resonance amplifier according to the invention.

FIG. 4a shows a common supply of a single input signal voltage to Vi and Vq, which input signal voltage is selectively amplified and converted into a pair of phase quadrature output voltages at VI and VQ which are mutually added in an adder circuit, resulting in a single output voltage.

Figure 4B:
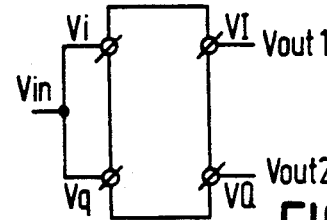

FIG. 4b also shows a common supply of a single input signal voltage to Vi and Vq, the tunable resonance amplifier RA functioning as a selective phase splitter. A single input voltage is selectively amplified and converted or split up into a pair of phase quadrature output voltages.

Figure 4C:
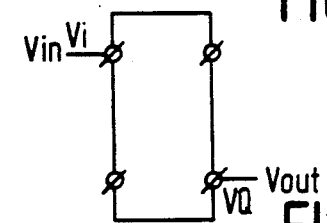

FIG. 4c shows the supply of a single input voltage to Vi and the decrease of a single output voltage at VQ which is shifted 90° or substantially 90° in phase with respect to Vi.

Figure 4D:
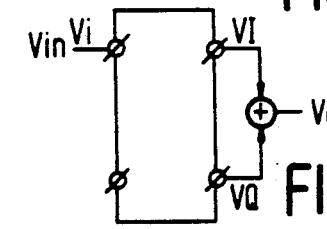

FIG. 4d shows the supply of a single input voltage to Vi and an addition of the phase quadrature output voltages obtained from this input voltage and resulting in a single output voltage.

Figure 4E:
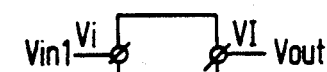

FIG. 4e shows the tunable resonance amplifier RA as a selective amplifier of phase quadrature voltages, with a pair of phase quadrature input voltages being applied to Vi and Vq and a pair of phase quadrature output voltages being supplied from VI and VQ.

Figure 4F:
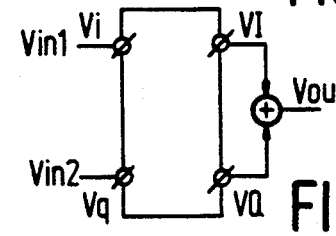

FIG. 4f shows the tunable resonance amplifier RA as a selective interface stage from quadrature to non-quadrature signals in which a pair of phase quadrature input voltages is selectively amplified in a pair of phase quadrature output voltages, which output voltages are mutually added in an adder circuit and result in a single output voltage.

Figure 5:
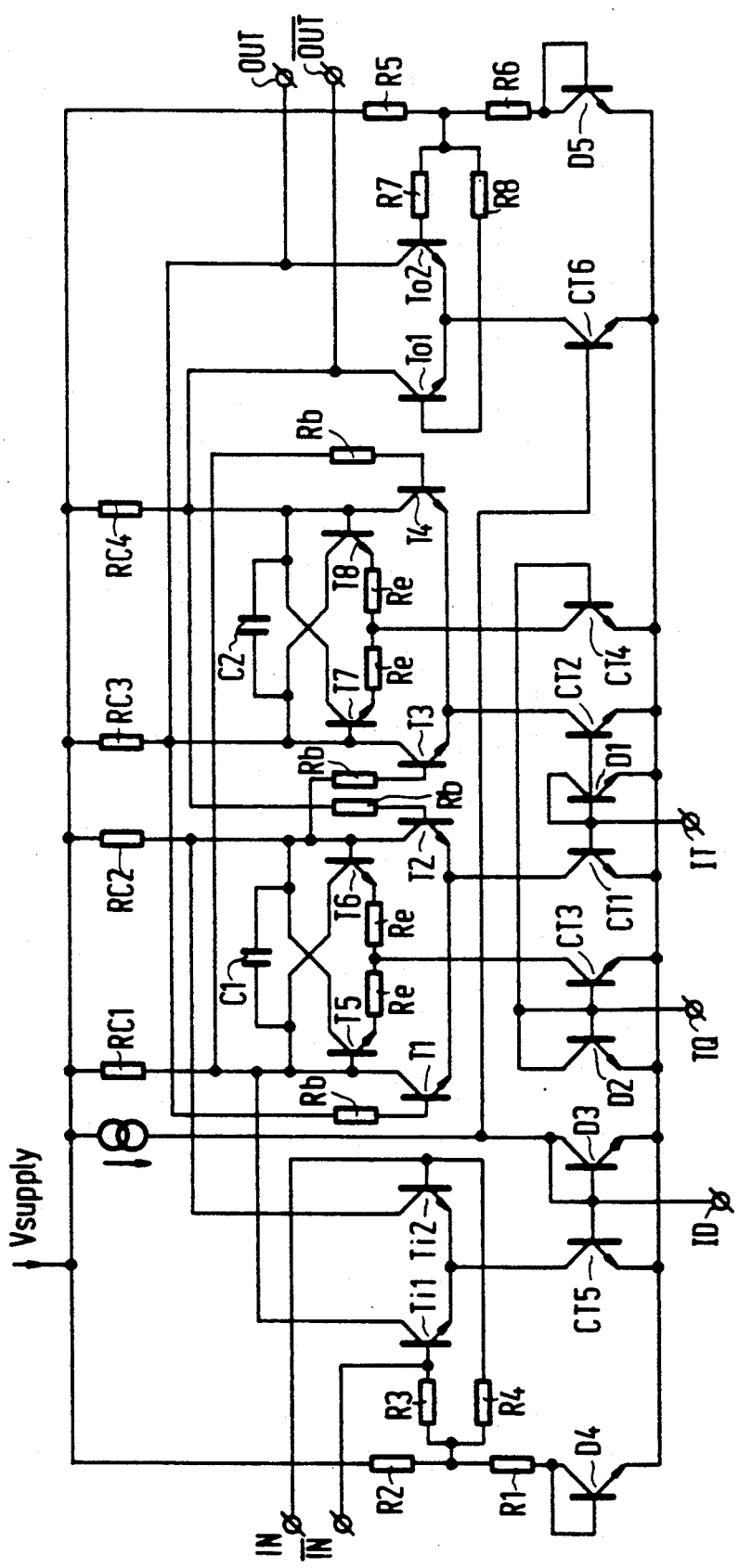
FIG. 5 shows a first integrable embodiment of a resonance amplifier according to the invention.

FIG. 5 shows a practical embodiment of a tunable resonance amplifier according to the invention which is particularly suitable to be realised in bipolar IC technology with first to fourth controllable transconductance circuits comprising first to eighth transistors T1 to T8 and first to fourth current source transistors CT1 to CT4 each of which functions as a controllable current source. The emitters of T1 and T2, and T3 and T4 are mutually directly coupled and those of T5 and T6, and T7 and T8 are each connected to a common emitter tail via a degeneration resistor Re. The emitter tail of the first to fourth difference pairs T1, T2; T3, T4, T5, T6 and T7, T8 thus obtained incorporates the current source transistors CT1 to CT4.

Said first to fourth difference pairs together with the current source transistors CT1 to CT4 constitute a practical realisation of the first to fourth controllable transconductance circuits TC1 to TC4 of FIG. 1. The current source transistors CT1 and CT2, and CT3 and CT4 are output transistors of a first and a second controllable current mirror circuit, respectively, with input control transistors D1 and D2 functioning as a diode. The collectors of T1 to T4 are connected to the power supply voltage via first to fourth mutually equal load resistors RC1 and RC2, while a first capacitance C1 and a second capacitance C2 are arranged between the collectors of T1 and T2, and T3 and T4, respectively. The collectors of T3, T4, T2 and T1 are coupled to the bases of T1 to T4, respectively, via a base series resistor Rb. Due to this mutual collector-base coupling a negative feedback of a cascade circuit of the first and second transconductances is obtained.

The third and fourth transconductance circuits are each positively fed back from output to input and are connected to the outputs of the first and the second transconductance circuits, respectively, because the collectors of T5 to T8 are connected to the bases of T6, T5, T8 and T7, respectively, and the collectors of T1 to T4 are connected to the bases of T5 to T8, respectively.

The tunable resonance amplifier also comprises a controllable input current transconductance circuit having first and second emitter-coupled input transistors Ti1 and Ti2, respectively, with a controllable current source CT5 in a common emitter tail. The collectors of Ti1 and Ti2 are connected to the collectors of T1 and T2 and to the bases of T4 and T3, respectively. The bases of Ti1 and Ti2 are connected to a balanced input of the resonance amplifier and via mutually equal base resistors R3 and R4 to a common output of a voltage divider D4, R1, R3 for a suitable working point of Ti1 and Ti2. A balanced output voltage from the collectors of T3 and T4 is applied to a balanced output of the tunable resonance amplifier.

The tunable resonance amplifier comprises first and second emitter-coupled output transistors To1 and To2 with a controllable current source transistor CT6 in a common emitter tail. The bases of To1 and To2 are connected via mutually equal base resistors R7 and R8 to a common output of a voltage divider D5, R5, R6 for a suitable working point of To1 and To2, while the collectors are connected both to the collectors of T4 and T3 and to a balanced output of the resonance amplifier. The controllable current source transistors CT5 and CT6 constitute output transistors of a third controllable current mirror circuit with an input control transistor D3 functioning as a diode. Said first to third controllable current mirror circuits are controllable/adjustable by means of a tuning, a bandwidth and a gain control current It, Iq and Id at control inputs IT, TQ and ID, respectively, which control inputs are coupled to the bases of D1 to D3, respectively. These control currents are mirrored in the first to third current mirror circuits to the output transistors CT1, CT2; CT3, CT4; CT5, CT6.

The output difference pair To1, To2 mainly serves to obtain a mutually equal DC bias of the two sections constituted by the first and third, and the second and fourth transconductances.

In the embodiment shown each one of the third and fourth controllable transconductance circuits T5, T6, CT3 and T7, T8, CT4 constitutes a controllable negative resistor which provides the possibility of compensating for an increase in bandwidth and a decrease in gain due to a decrease of the input resistance ro of T3, T4 and T1, T2 without varying the load resistors RC1-RC2. A decrease of ro is produced in the case of an increase of the tuning control current It, i.e. when tuning from lower to higher frequencies. Also the base series resistors Rb counteract an increase of the bandwidth and a decrease of the gain in the case of an increasing frequency. Although in the embodiment shown the use of the negative resistor constituted by T5, T6, CT3 and T7, T8, CT4 is shown in combination with the use of the base series resistors Rb, the two applications are alternative solutions to the same problem and the one application may be used without using the other.

In practice the tuning frequency FR, the bandwidth BW and the gain G for the embodiment shown appears to be approximately satisfying the following equations at low values of Rb and Re:

$$FR \approx \frac{It}{8\pi \cdot VT \cdot C}$$

$$BW \approx \frac{2VT - R \cdot Iq}{4\pi \cdot VT \cdot R \cdot C}$$

$$G \approx \frac{Id \cdot R}{4VT - 2RIq}$$

in which VT is the thermal potential and is approximately 25 mV and It, Iq and Id are the currents of the current source transistors CT1, CT2, CT3, CT4 and CT5, CT6, respectively.

In a practical application for tuning in the RF-AM radio frequency range of 400 kHz–1600 kHz the value of the resistors R3, R4, R7 and R8 was 2 kΩ, R2, R5 70 kΩ; R1, R6 30 kΩ; RC-1RC4 25 kΩ; Re 15 kΩ; Rb=O (short-circuited); the capacitors C1, C2, 32 pF; the power supply voltage 1.8 V; the power consumption 0.3 mW; Id 30 μA; and Iq=2 μA+ItX),18.

An alternative embodiment with a constant transconductance of the third and fourth transconductance circuits is obtained if, unlike the aforegoing dimensioning, Iq is adjusted at 3.8 μA and Rb is chosen to be 7 kΩ.

In a practical application for tuning in the RF-FM radio frequency range of 85 MHz–110 MHz the value of the resistors RC1-RC4 was 10 kΩ; Re 3.3 kΩ; Rb 40 Ω the current Id 30 μA; Iq 10 μA; the capacitor C1, C2 0.5 pF; the power supply voltage 1.8 V; the power consumption 0.55 mW.

Another simplified embodiment (not shown) of a tunable resonance amplifier according to the invention which is also suitable for tuning in the said RF-FM radio frequency range is obtained by completely dispensing with the third and fourth transconductance circuits T5, T6, CT3 and T7, T8, CT4 (not shown) and by arranging first and second load resistors (not shown) in series with C1 and C2, respectively, between the collectors of T1 and T2, and T3 and T4, respectively.

In a practical realisation of such a simplified embodiment of the value of the resistors R3, R4, R7, R8 was 2 kΩ; R2, R5 1 MΩ; R1, R6 60 kΩ; RC1-RC4 45 kΩ; the first and second load resistors (not shown) 50 Ω; the current Id 26 μA; the power supply voltage 2.7 V; the power consumption 0.6 mW.

Figure 6A:
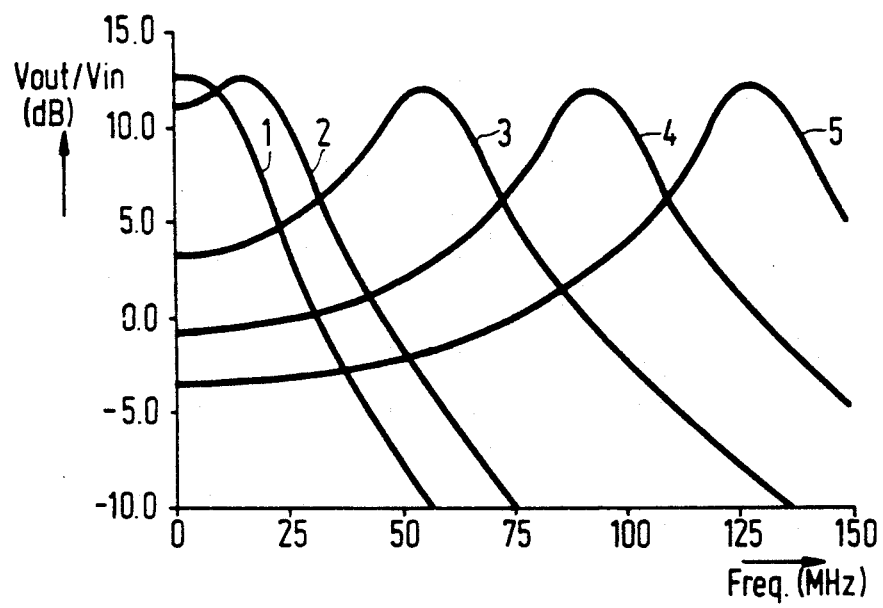
FIG. 6a shows the bandpass characteristic of the first embodiment at different adjustments of the first and second transconductance circuits.

FIG. 6a shows curves 1-5 at different tuning currents It and constant currents Iq and Id of the bandpass characteristic of the tunable resonance amplifier shown in FIG. 5 and realised in a bipolar IC technology with LOCOS insulation, 2 μm emitter width and a transistor cut-off frequency of approximately 4 GHz. In this amplifier the base-series resistors Rb and the degeneration resistors Re were short-circuited and the resistors RC1-RC4 had a value of 5 kΩ and C1, C2 were 8 pF. It can clearly be seen that the bandwidth is substantially constant between 50 MHz and 150 MHz.

Figure 6B:
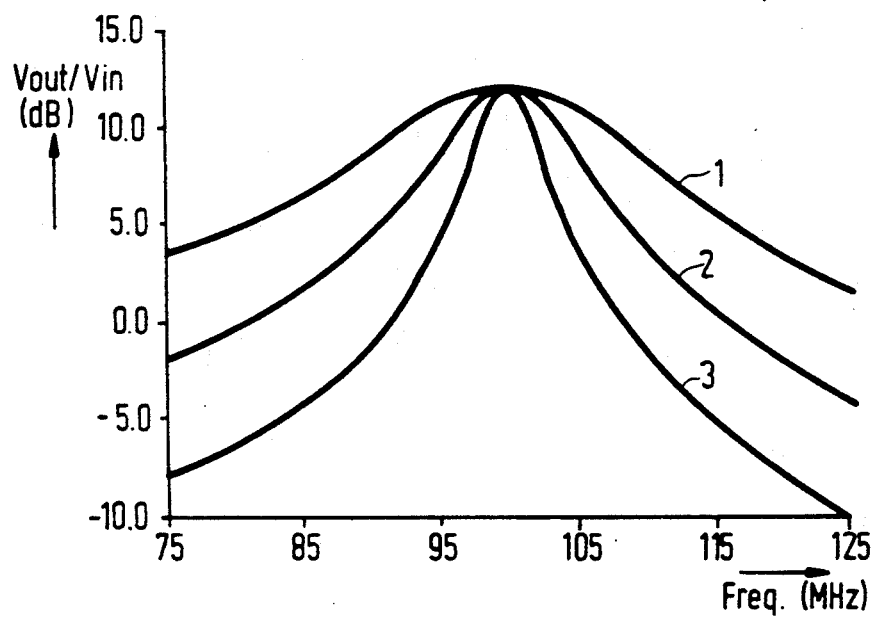
FIG. 6b shows the bandpass characteristic of the first embodiment at different adjustments of the third and fourth transconductance circuits.

FIG. 6b shows curves 1-3 of the bandpass characteristic of the last-mentioned tunable resonance amplifier at a constant current It and different currents Iq and Id. It can clearly be seen that there is no detuning.

An embodiment which is suitable for tuning in the RF-TV VHF/UHF frequency range of 50 MHz-900 MHz is obtained by negatively feeding back T5 and T6 and T7 and T8 (not shown) in the embodiment of FIG. 3 and by arranging first and second load series resistors in series with C1 and C2 (not shown). Such a negative feedback is achieved by providing a collector-base connection for each one of the transistors T5-T8.

In a practical realisation both It and Iq were controlled and the resistors R3, R4, R7, R8 had a value of 2 kΩ; R2, R5 1 MΩ; R1, R6 60 kΩ; RC1-RC4 5 kΩ; the first and second load resistors (not shown) 100 Ω each; Rb=Re=0 (short-circuited); the load capacitor C1, C2 0.5 pF; the current Id 200 μA; the power supply voltage 5 V; the power consumption 12.5 mW.

Figure 7:
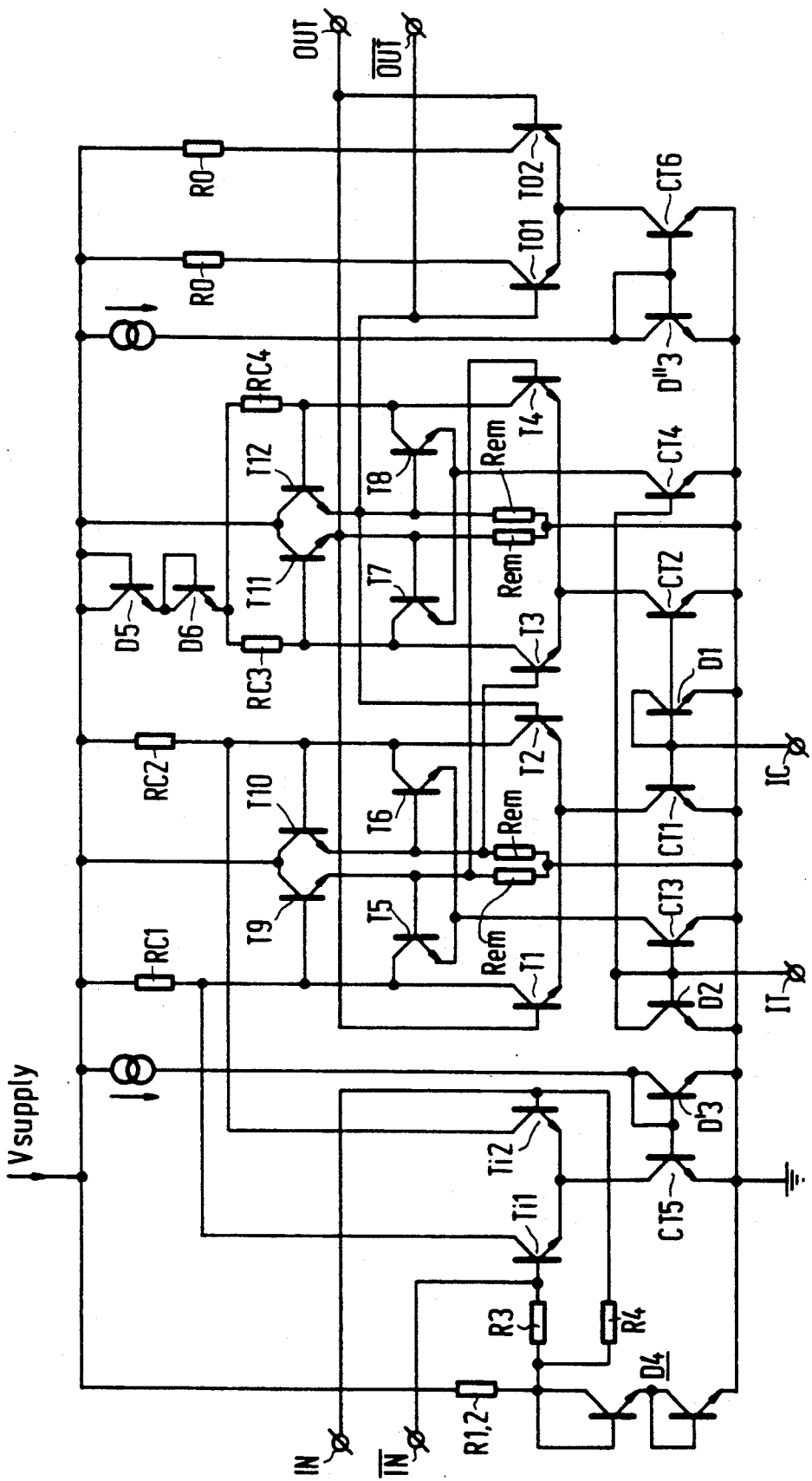
FIG. 7 shows a second integrable embodiment of a resonance amplifier according to the invention.

FIG. 7 shows an embodiment of a tunable resonance amplifier which is suitable for tuning in the TV satellite frequency range of approximately 900 MHz-2 GHz. The capacitive load of the first and second transconductance circuits T1, T2, CT1 and T3, T4, CT2 is constituted in this case by the parasitic collector base capacitances at the load resistors RC1-RC4. To prevent oscillation due to delay time effects, T5 and T6 and T7 and T8 are negatively fed back via ninth to twelfth transistors T9 and T10 and T11 and T12 arranged as emitter followers. These emitter followers T9-T12 also increase the cut-off frequency of the signal processing transistors T1-T4 and are each connected to ground via an emitter resistor Rem. Furthermore TC3 and RC4 are commonly connected to the power supply voltage via a diode series pair D5, D6. The diode series pair D5, D6 is used for an equal d.c. bias of the first and second sections. The output stage only serves for measuring purposes in this case and simulates a load. It does not have a signal processing function and is therefore not further described.

In a practical realisation the values of the resistors R1, 2 were 30 kΩ; R, R4 2 kΩ; R0 10 Ω; Rem 1 kΩ; RC1-RC4 750 Ω; the power supply voltage 5 V; the power consumption 75 mW.

Figure 8:
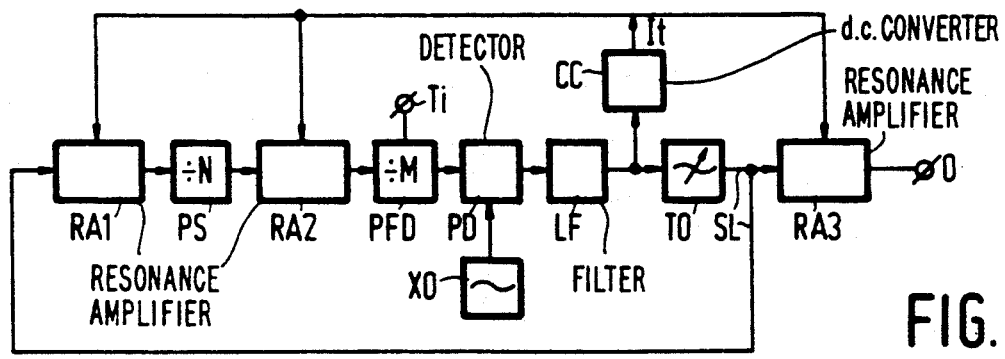
FIG. 8 shows an embodiment of a frequency synthesis circuit comprising a plurality of tunable resonance amplifiers according to the invention.

FIG. 8 shows a frequency synthesis circuit according to the invention, comprising a phase-locked loop successively incorporating a first tunable resonance amplifier RA1, a fixed frequency divider or prescaler PS for dividing the frequency by a fixed division factor N, a second tunable resonance amplifier RA2, a programmable frequency divider PFD having a control input Ti for a control or programming of the frequency division factor M, a phase detector from which a fixed reference frequency is applied from a fixed oscillator XO, a loop filter LF and a voltage-controlled oscillator TO which functions as a tuning oscillator.

The output of TO is connected to the input of RA1 via a connection SL1 and to a third tunable resonance amplifier RA3 an output O of which conveys the selectively amplified oscillator signal of TO, for example for a mixing conversion of an RF-AM or FM radio signal, a TV-VHF/UHF or satellite reception signal to an intermediate frequency.

In the embodiment shown RA1-RA3 correspond to one of the aforementioned embodiments, dependent on the frequency range in which the frequency synthesis circuit operates. In this circuit the d.c. control signal at the output of LF is not only used for a phase/frequency control of TO but also for a control of the tuning of RA1-RA3. To ensure an accurate synchronisation in the tuning of RA1-RA3 and TO, the d.c. control signal is suitably converted into the tuning control current It by means of a d.c. conversion circuit CC, dependent on the implementation of RA1-RA3 and TO. If a bandwidth control is also required, for example in the TV satellite frequency range, CC also supplies the control currents Iq (not shown) derived from the d.c. control signal.

Since in practice the tuning oscillator TO, when realised in an integrated form, is not formed on the same substrate as the other circuits of the loop, the signal level at the connection SL should be sufficiently small so as to comply with the current requirements imposed on oscillator radiation. To ensure a correct operation of the loop, RA1 selectively amplifies the oscillator signal before there is a frequency division in PS. A further improvement of the loop operation is obtained with RA2 which increases the logic margin, i.e. the difference between the 0 and 1 level of the signal at the output of PS. Since RA2 is operative in a lower frequency range than RA1, an adaptation of the tuning control signal It may be necessary (not shown). The third tunable resonance amplifier RA3 amplifies the comparatively weak oscillator signal or SL selectively to a signal level which can be used for mixing.

Figure 9:
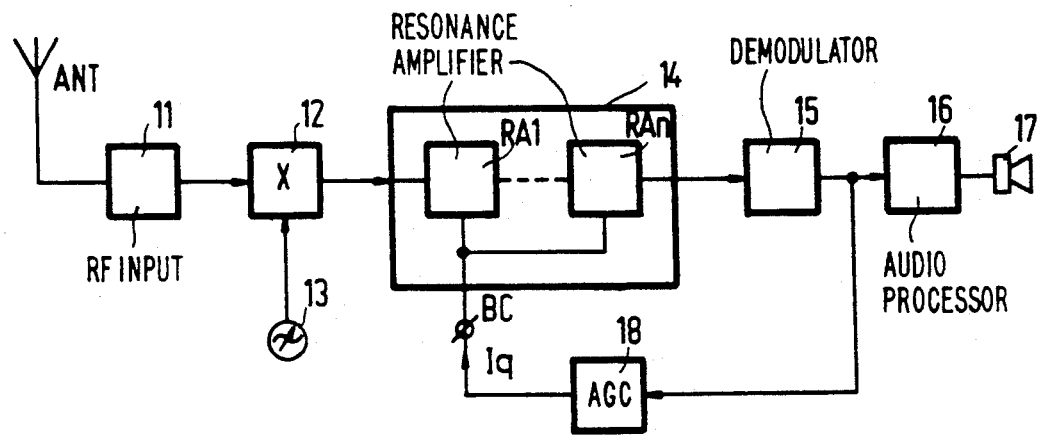
FIG. 9 shows an AM superheterodyne receiver according to the invention.

FIG. 9 shows an AM superheterodyne receiver according to the invention comprising successively an RF input section 11, a mixer stage 12 to which a tunable mixer signal is applied from a tuning oscillator 13 for converting a desired AM-RF signal to a fixed AM intermediate frequency (AM-IF), an AM-IF section 14 for amplifying and selecting the AM-IF signal, an AM demodulator 15 for demodulating the AM-IF signal, an audio processing section 16 and a sound reproducing device 17 for processing and reproducing the demodulated audio signal.

The AM-IF section 14 comprises a cascade circuit of M tunable resonance amplifiers RA1-RAn each of which is implemented as shown, for example, in FIG. 3. The first and second controllable transconductances TC1 and TC2 are fixed at a value at which the resonance frequency $f_{res}$ corresponds to the AM-IF. The third and fourth controllable transconductances TC3 and TC4 are controlled from a common control input BC to which a gain control signal (AGC signal) current Iq is applied from an AGC signal generating circuit 18. The AGC signal generating circuit 8 is coupled to an output of the AM demodulator 15 and derives the AGC signal current Iq from the amplitude of the demodulated audio signal by means of a suitably chosen integration or low-pass filtering, which signal current is a measure of the reception field strength. By controlling TC3 and TC4 by means of Iq at a decreasing reception field strength in the manner described hereinbefore so that the selective amplification of each resonance amplifier RA1 to RAn increases, their bandwidth simultaneously decreases. Consequently not only an amplitude stabilization but also an adaptive noise level stabilization is obtained.

Figure 10:
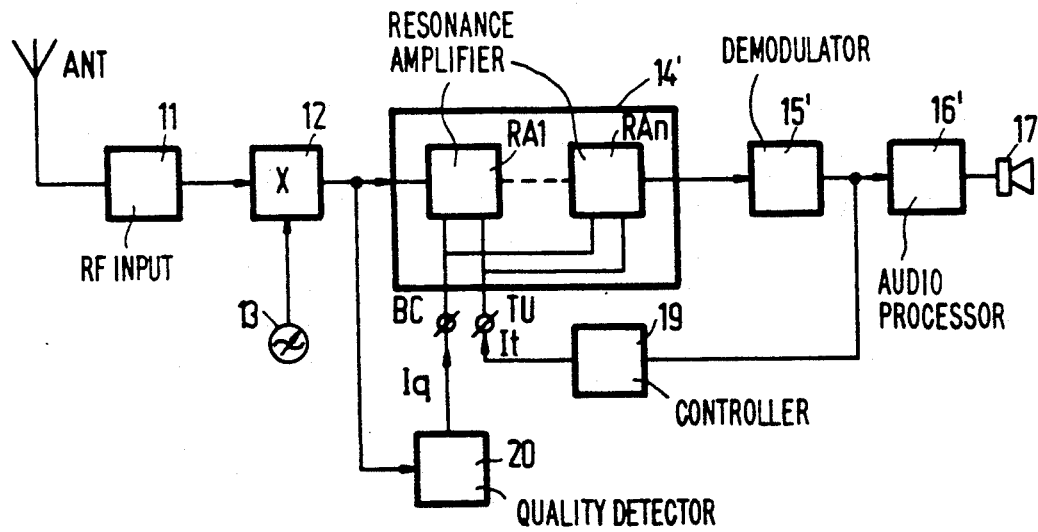
FIG. 10 shows an FM superheterodyne receiver according to the invention.

FIG. 10 shows an FM superheterodyne receiver whose subcircuits functionally corresponding to those of FIG. 9 have the same references. In this receiver an FM-RF reception signal is converted to an FM-IF signal with a fixed IF carrier frequency by means of the mixer stage 12. Subsequently the FM-IF signal is IF selected in the FM-IF section 14' and the FM-IF signal is demodulated in an FM demodulator 15'. Subsequently the baseband signal is processed in a baseband signal processing unit 16' which may comprise, for example, a stereodecoder and/or an RDS signal processing device.

Unlike the receiver of FIG. 9, not only the third and fourth transconductances but also the first and second transconductances TC1 and TC2 of each resonance amplifier RA1-RAn of the FM-IF section 14' are controlled. To this end their control inputs are coupled to a common tuning control input TU. A tuning control current It is applied to this tuning control input TU from a tuning control signal generating circuit 19. This circuit 19 derives said tuning control current It from the baseband FM modulation signal at the output of the FM demodulator 15' or (not shown) from the filtered FM-IF signal at the output of the FM-IF section 14', so that the amplitude of this tuning control current substantially follows the baseband FM modulation signal. Consequently the resonance frequency of the IF-FM section 14' instantaneously follows the FM modulation of the IF carrier so that the bandwidth of this IF-FM section 14' can be chosen to be considerably narrower than that of conventional fixed IF-FM filters without a loss of desired signal components in the FM-IF signal. As compared with conventional FM receivers, a considerably improved IF channel selectivity is obtained.

The use of a narrow-band IF filter whose resonance frequency varies with the FM modulation of the IF-FM signal, is known, for example from U.S. Pat. No. 3,541,451. However, by using the tunable resonance amplifier according to the invention as a varying narrow-band IF filter, the implementation of such a receiver is considerably simplified and realised at low cost.

The third and fourth transconductances TC3 and TC4 of each resonance amplifier RA1-RAn incorporated in the FM-IF section 4 are now controlled from a reception quality detector 20. This detector 20 provides a measure of the reception quality of the desired FM signal in the control current Iq, which quality measure is determined, inter alia by the field strength, noise nd multi-path reception. Such a detector is known per se, for example from U.S. Pat. No. 4,491,957 and the bandwidth of the IF-FM section 4' varies in such a way that it increases with an improved reception quality, and conversely. Consequently an automatic adaptive IF selectivity is obtained which stabilizes the signal processing of the receiver against reception quality variations. It will be evident that the automatic bandwidth control can be used independently of the afore-mentioned frequency control of the IF-FM section 4'.

We claim:

1. A tunable resonance amplifier comprising a non-regenerative DC negative feedback loop which includes means for controllably amplifying signals at signal frequencies to provide a controlled loop gain, said loop having a signal path for said signals from an input to an output thereof and a feedback path for said signals from said output to said input; characterized in that:
    said amplifying means comprises a pair of amplifiers having controllable gain factors, at least one of said amplifiers being in said feedback path;
    said loop further includes a pair of first-order low-pass RC filters, at least one of said filters being in said signal path; and
    said amplifiers and said filters are arranged in cascade around said loop in a sequence such that the respective amplifiers alternate with the respective filters;
    the pair of amplifiers being substantially identical and the pair of filters being substantially identical.

2. A tunable resonance amplifier as claimed in claim 1 characterized in that the first and second controlled amplifiers comprise first and second transconductance circuits each having a controllable transconductance from a voltage input to a current output and in that the in the loop the current outputs of the first and second transconductance circuits are coupled via parallel RC members of the first and second RC filters to the voltage inputs of the second and first transconductance circuits, respectively, said loop comprising means for signal inversion, the input of the resonance amplifier being coupled to the input of at least one of the two transconductance circuits for applying an input signal current thereto and the output of the resonance amplifier being coupled to the output of one of the two transconductance circuits for applying an output signal voltage thereto.

3. A tunable resonance amplifier as claimed in claim 2, characterized in that the input and the output of the tunable resonance amplifier comprise an in-phase and a quadrature input terminal and an in-phase and a quadrature output terminal, respectively, one of the two first and second transconductance circuits being arranged between said two input terminals and output terminals.

4. A tunable resonance amplifier as claimed in claim 2, characterized in that the amplifier comprises third and fourth transconductance circuits; and
    the outputs of the first and second transconductance circuits are connected to inputs and outputs of said third and fourth transconductance circuits, respectively.

5. A tunable resonance amplifier as claimed in claim 4, characterized in that each one of the third and fourth transconductance circuits is positively fed back from the output to the input.

6. A tunable resonance amplifier as claimed in claim 4, characterized in that each one of the third and fourth transconductance circuits is negatively fed back from the output to the input.

7. A tunable resonance amplifier as claimed in claim 4, characterized in that the transconductances of the third and fourth transconductance circuits are controllable.

8. A tunable resonance amplifier as claimed in claim 2, characterized in that the input signal of the resonance amplifier is applied via an input transconductance circuit to the input of at least one of the two first and second transconductance circuits.

9. A tunable resonance amplifier as claimed in claim 8, characterized in that the input transconductance circuit is controllable.

10. A tunable resonance amplifier as claimed in claim 2, characterized in that the first and second transconductance circuits comprise first and second difference pairs, respectively, which first and second difference pairs comprise first and second, and third and fourth emitter-coupled transistors with a first and a second current source transistor arranged in a common emitter tail configuration, said two current source transistors being controllable from a first common control circuit having a tuning control input for controlling the transconductance of the first and second transconductance circuits, the collectors of said first to fourth transistors each being connected to the power supply voltage via first to fourth load resistors, respectively, and being coupled to the bases of the fourth, third, first and second transistors, while first and second capacitances are arranged between the collectors of the first and second, and the third and fourth transistors, respectively.

11. A tunable resonance amplifier as claimed in claim 10, characterized in that first and second load series resistors are arranged in series with the first and second capacitances, respectively.

12. A tunable resonance amplifier as claimed in claim 10, characterized in that base series resistors are arranged between the collectors of the third, fourth, second and first transistors and the bases of the first to fourth transistors.

13. A tunable resonance amplifier as claimed in claim 10, characterized in that the amplifier comprises third and fourth transconductance circuits, the outputs of the first and second transconductance circuits are connected to inputs and outputs of said third and fourth transconductance circuits, respectively, and the third and fourth transconductance circuits comprise third and fourth difference pairs with fifth and sixth, and seventh and eighth emitter-coupled transistors, respectively, comprising a third and fourth current source transistor arranged in a common emitter tail configuration for adjusting the transconductance of the third and fourth transconductance circuits, the bases of the fifth to eighth transistors being coupled to the collectors of the first to fourth transistors and the transistors of the third and fourth difference pairs being fed back from collectors to bases.

14. A tunable resonance amplifier as claimed in claim 13, characterized in that the third and fourth current source transistors are controllable from a second common control circuit for controlling the transconductance of the third and fourth transconductance circuits.

15. A tunable resonance amplifier as claimed in claim 13, characterized in that the collectors of the fifth to eighth transistors are coupled to the bases of the sixth, fifth, eighth and seventh transistors, respectively.

16. A tunable resonance amplifier as claimed in claim 13, characterized in that each one of the fifth to eighth transistors is fed back from collector to base.

17. A tunable resonance amplifier as claimed in claim 13, characterized in that an emitter resistor is incorporated in the emitter lead of each one of the fifth to eighth transistors.

18. A tunable resonance amplifier as claimed in claim 16, characterized in that the fifth to eighth transistors are fed back from collector to base via the base-emitter junction of ninth to twelfth transistors, respectively, and in that the collectors of the first to fourth transistors are coupled to the bases of the fourth, third, first and second transistors, respectively.

19. A tunable resonance amplifier as claimed in claim 10, characterized in that the input transconductance circuit comprises a differential stage having first and second emitter-coupled input transistors and a current source in a common emitter lead whose collectors are connected to the bases of the transistors of one of the two difference pairs.

20. A frequency synthesis circuit comprising a tunable resonance amplifier as claimed in claim 1, further comprises a frequency divider circuit, a phase detector, and a voltage-controlled oscillator incorporated in a phase-locked loop, further characterized in that said tunable resonance amplifier is arranged between the voltage-controlled oscillator and the frequency divider circuit, one of said filters being coupled to a tuning control input of the tunable resonance amplifier for simultaneously tuning the voltage-controlled oscillator and the tunable resonance amplifier.

21. A superheterodyne receiver successively comprising an RF input section, a tunable mixer stage, an IF section and a demodulation device, characterized in that:

the IF section comprises a tunable resonance amplifier having a non-regenerative DC negative feedback loop including means for amplifying signals at signal frequencies to provide a controlled loop gain, said means for amplifying comprising first and second controlled amplifiers, said loop has a signal path for said signals arranged from an input to an output; and a feedback path for said signals arranged from said output to said input, and said loop includes a first and a second first-order low-pass RC filter, and means for signal inversion, the signal path incorporates one of said RC filters, and said feedback path incorporates the other of said RC filters and said means for amplifying, said first and second controlled amplifiers are first and second transconductance circuits each having a controllable transconductance from a voltage input to a current output, the current outputs of the first and second transconductance circuits being coupled via parallel RC members of the first and second RC filters to the voltage inputs of the second and first transconductance circuits, respectively; and the input of the resonance amplifier being coupled to the input of at least one of the two transconductance circuits for applying an input signal current thereto and the output of the resonance amplifier being coupled to the output of one of the two transconductance circuits for applying an output signal voltage thereto, and the outputs of the first and second transconductance circuits are connected to inputs and outputs of third and fourth transconductance circuits, respectively, said third and fourth transconductance circuits being controllable and being coupled via a control input to signal circuits.

22. A superheterodyne receiver successively comprising an RF input section, a tunable mixer stage, an IF section and a demodulation device, characterized in that:

the IF section comprises a tunable resonance amplifier having a non-regenerative DC negative feedback loop including means for amplifying signals at signal frequencies to provide a controlled loop gain, said means for amplifying comprising first and second controlled amplifiers, said loop has a signal path for said signals arranged from an input to an output; and a feedback path for said signals arranged from said output to said input, and said loop includes a first and a second first-order low-pass RC filter, and means for signal inversion, said first controlled amplifier supplies one part only of said controlled loop gain, and said second controlled amplifier supplies the other part of said controlled loop gain; and the signal path incorporates both said RC filters and said first controlled amplifier, said first and second controlled amplifiers are first and second transconductance circuits each having a controllable transconductance from a voltage input to a current output, the current outputs of the first and second transconductance circuits being coupled via parallel RC members of the first and second RC filters to the voltage inputs of the second and first transconductance circuits, respectively; and the input of the resonance amplifier being coupled to the input of at least one of the two transconductance circuits for applying an input signal current thereto and the output of the resonance amplifier being coupled to the output of one of the two transconductance circuits for applying an output signal voltage thereto, and the outputs of the first and second transconductance circuits are connected to inputs and outputs of third and fourth transconductance circuits, respectively, said third and fourth transconductance circuits being controllable and being coupled via a control input to signal circuit.

23. A superheterodyne receiver as claimed in claim 21 or 22, characterized in that said IF section is an AM-IF section; said demodulation device is an AM demodulator, and said receiver includes an automatic gain control signal generating device which is said demodulated signal circuit and has an AGC output, said third and fourth transconductance circuits being controllable and having respective control inputs, said control inputs being coupled to said AGC output.

24. A superheterodyne receiver as claimed in claim 21 or 22, characterized in that said IF section is an FM-IF section; said demodulation device is an FM demodulator which is said demodulated signal circuit and has a demodulated output, said third and fourth transconductance circuits being controllable and having respective control inputs, said control inputs being coupled to said demodulated output.

* * * * *